United States Patent
Kim et al.

(10) Patent No.: US 10,741,701 B2
(45) Date of Patent: Aug. 11, 2020

(54) HIGH VOLTAGE POWER DIODE

(71) Applicant: DB HITEK CO., LTD., Seoul (KR)

(72) Inventors: Jong Min Kim, Seoul (KR); Tae Young Joung, Seoul (KR)

(73) Assignee: DB HITEK CO., LTD., Seoul (KR)

(*) Notice: Subject to any disclaimer, the term of this patent is extended or adjusted under 35 U.S.C. 154(b) by 0 days.

(21) Appl. No.: 16/246,206

(22) Filed: Jan. 11, 2019

(65) Prior Publication Data
US 2019/0214508 A1    Jul. 11, 2019

(30) Foreign Application Priority Data
Jan. 11, 2018   (KR) .................. 10-2018-0003706

(51) Int. Cl.
| | | |
|---|---|---|
| *H01L 29/861* | (2006.01) | |
| *H01L 29/06* | (2006.01) | |
| *H01L 29/87* | (2006.01) | |

(52) U.S. Cl.
CPC ...... *H01L 29/8611* (2013.01); *H01L 29/0615* (2013.01); *H01L 29/0619* (2013.01); *H01L 29/0649* (2013.01); *H01L 29/87* (2013.01)

(58) Field of Classification Search
CPC .............. H01L 29/8611; H01L 29/062; H01L 29/0619; H01L 29/0649; H01L 29/0615; H01L 29/87; H01L 29/861
See application file for complete search history.

(56) References Cited

U.S. PATENT DOCUMENTS 7,019,377 B2 *   3/2006   Tsuchiko ............ H01L 27/0629
                                                                                                    257/379
2019/0081045 A1 *  3/2019   Lin ..................... H01L 27/0921

* cited by examiner

*Primary Examiner* — Jasmine J Clark
(74) *Attorney, Agent, or Firm* — Patterson Thuente Pedersen, P.A.

(57) ABSTRACT

A high voltage power diode includes a P-type semiconductor substrate, a P-type epitaxial layer provided on the semiconductor substrate, an N-type isolation layer provided at a lower portion of the epitaxial layer, the isolation layer extending in a horizontal direction, oxide isolation layer provided at an upper surface of the epitaxial layer, the oxide isolation layer defining the epitaxial layer into an anode region and a cathode region, an first well of N-type conductivity, and a second well of P-type conductivity are provided on the upper surface of the epitaxial layer, a guard ring structure provided on the upper surface of the epitaxial layer and spaced apart from the second well in a horizontal direction, the guard ring structure including a third well having a first sub-well of N-type conductivity, a second sub-well of P-type conductivity and an third sub-well of N-type conductivity which are arranged in a horizontal direction, and a guard ring terminal electrically connected to the anode terminal.

10 Claims, 3 Drawing Sheets

HIGH VOLTAGE POWER DIODE

CROSS-REFERENCE TO RELATED APPLICATION

This application claims priority to Korean Patent Application No. 10-2018-0003706, filed on Jan. 11, 2018 and all the benefits accruing therefrom under 35 U.S.C. § 119, the contents of which are incorporated by reference in their entirety.

TECHNICAL FIELD

The present disclosure relates to a high voltage power diode. More particularly, the present invention relates to a high voltage power diode having an increased breakdown voltage.

BACKGROUND

In general, power diodes are known that can be implanted as a DC/AC converter for a high voltage resistant and low current driving device. However, such power diodes have a problem in that it is difficult to use in a converter for a high current due to low efficiency and latch-up occurrence. Nonetheless, such power diodes have been applied to various purposes such as an electrostatic protection devices.

It is desirable for a power diode to exhibit a high breakdown voltage. The power diode may include a P-type substrate, an anode and a cathode. In order to increase the breakdown voltage, a guard ring structure that surrounds the anode may be required.

In addition, a parasitic current can flow through the P-type substrate when a forward voltage is applied between the cathode and the anode of the power diode. Therefore, it may be required to suppress the parasitic current to improve the breakdown voltage of the power diode.

SUMMARY

The example embodiments of the present invention disclosed herein provide high voltage power diodes having a relatively high breakdown voltage and a relatively low parasitic current.

According to example embodiments of the present invention, a high voltage power diode includes a P-type semiconductor substrate, a P-type epitaxial layer provided on the semiconductor substrate, an N-type isolation layer provided at a lower portion of the epitaxial layer, the isolation layer extending in a horizontal direction, oxide isolation layer provided at an upper surface of the epitaxial layer, the oxide isolation layer defining the epitaxial layer into an anode region and a cathode region, an first well of N-type conductivity, provided at an upper surface of the epitaxial layer and in the anode region, the first well being configured to be electrically connected to an anode terminal, a second well of P-type conductivity, provided on the upper surface of the epitaxial layer and in the cathode region, the second well being configured to be electrically connected to the cathode terminal, a guard ring structure provided on the upper surface of the epitaxial layer and spaced apart from the second well in a horizontal direction, the guard ring structure including a third well having a first sub-well of N-type conductivity, a second sub-well of P-type conductivity and an third sub-well of N-type conductivity which are arranged in a horizontal direction, and a guard ring terminal electrically, connected to the anode terminal, and a P-sub region provided on the upper surface of the epitaxial layer to be horizontally spaced apart from the guard ring structure.

In an example embodiment, a P-type buried layer may further be interposed between the second sub-well and the isolation layer.

In an example embodiment, the guard ring structure may further include a P-type diffusion layer interposed between the first sub-well and the guarding ring terminal.

In an example embodiment, each of the second and the third wells may have a ring structure to surround the first well.

In an example embodiment, the second sub-well may have a depth larger than that of the first sub-well.

In an example embodiment, deep wells of N-type conductivity may be further provided each between the first well and the isolation layer, between the first sub-well and the isolation layer, and between the third sub-well and the isolation layer.

In an example embodiment, the P-sub region includes a fourth well of P-type conductivity, spaced apart from the guard ring structure in the horizontal direction.

In an example embodiment, the guard ring structure may further include a first diffusion layer of P-type conductivity, a second diffusion layer of N-type conductivity and a third diffusion layer of P-type conductivity arranged in the horizontal direction, the first to the third diffusion layers interposed between the first sub-well and the guard ring terminal.

In an example embodiment, wherein the guard ring structure may further include a fourth diffusion layer of N-type conductivity and a fifth diffusion layer of P-type conductivity arranged in the horizontal direction, the fourth and the fifth diffusion layers interposed between the first sub-well and the guard ring terminal.

In an example embodiment, the guard ring structure may further includes an impurity region surrounding the fifth diffusion layer.

According to some example embodiments of the present invention, the high voltage power diode includes the guard ring structure having the third well and the guard ring terminal electrically connected to the anode terminal. The third well includes the first sub-well, the second sub-well and the third sub-well arranged in the horizontal direction to define n NPN structure. Therefore, when a forward voltage is applied between the anode terminal and the cathode terminal, a hole current flows toward the P-sub region through the formed the first transistor of PNP type. At this time, the second sub-well 171b of the P-type conductivity may capture the hole current to reduce the hole current which flows toward the P-sub region so that the parasitic current flowing in the P-sub region have may decrease.

The guard ring structure may further include the P-type diffusion layer provided between the first sub-well and the guard ring terminal. When the forward voltage is applied between the anode terminal and the cathode terminal, the P-type diffusion layer may suppress electrons from flowing from the guard ring terminal into the first sub-well while the first transistor of PNP type operates. Therefore, a magnitude of the hole current which flows toward the second sub-well according to the operation of the first transistor is reduced. As a result, the parasitic current flowing into the P-sub region may be further reduced.

On the other hand, the guard ring structure may includes the first diffusion layer of P-type conductivity, the second diffusion layer of N-type conductivity and the third diffusion layer of P-type conductivity arranged in the horizontal direction, and the first to the third diffusion layers are provided between the first sub-well and the guard ring terminal. Thus, as the first and third diffusion layers have P-type conductivity, electrons may be suppressed from flowing from the first sub-well to the first transistor, thereby reducing the electron current into the first transistor. Therefore, a magnitude of the hole current which flows toward the second sub-well according to the operation of the first PNP transistor may be reduced. As a result, the parasitic current flowing to the P-sub region may be reduced. On the other hand, the second diffusion layer has the N-type conductivity, holes injected into the first sub-well according to the operation of the first transistor can be effectively charged into the first sub-well.

The above summary is not intended to describe each illustrated embodiment or every implementation of the subject matter hereof. The figures and the detailed description that follow more particularly exemplify various embodiments.

BRIEF DESCRIPTION OF THE DRAWINGS

Exemplary embodiments can be understood in more detail from the following description taken in conjunction with the accompanying drawings, in which.

Figure 1:
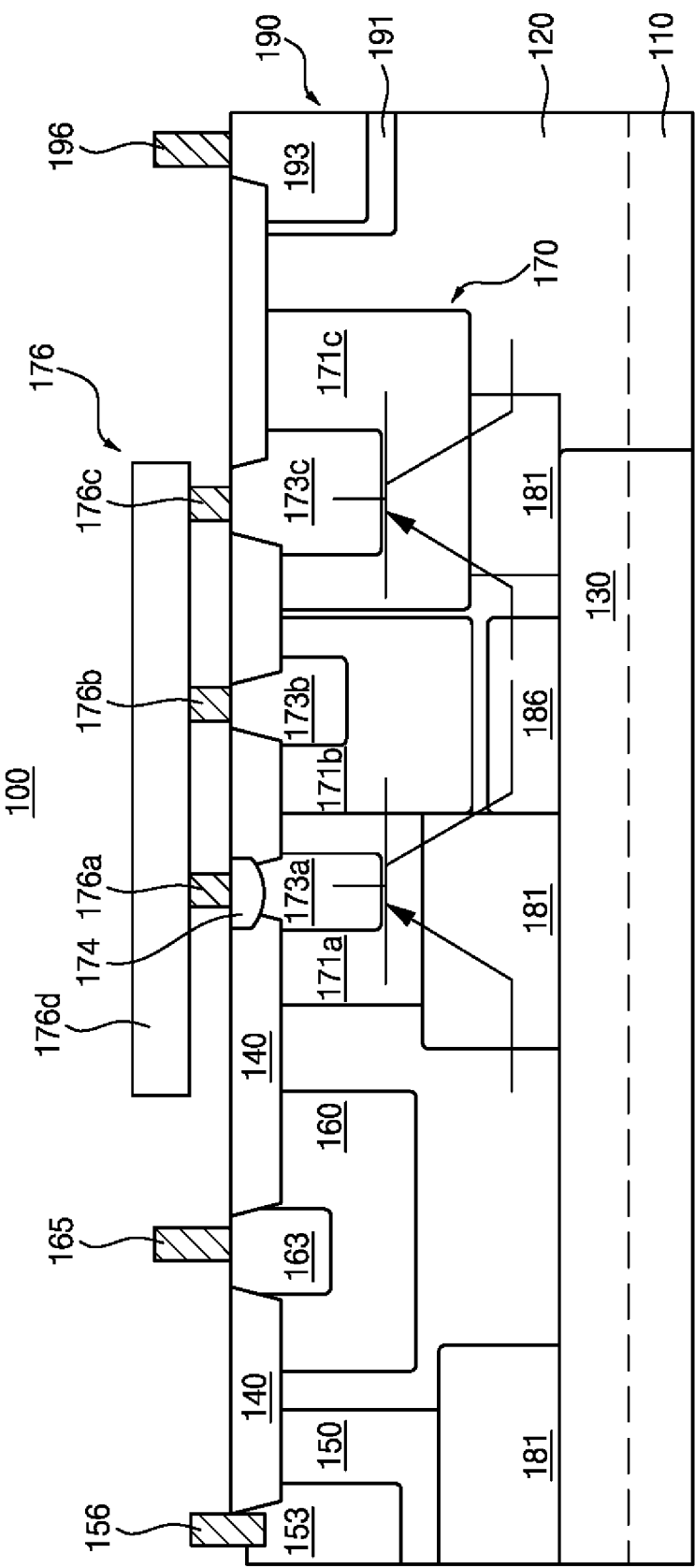
FIG. 1 is a cross sectional view illustrating a high voltage power diode in accordance with an embodiment of the present invention.

While various embodiments are amenable to various modifications and alternative forms, specifics thereof have been shown by way of example in the drawings and will be described in detail. It should be understood, however, that the intention is not to limit the claimed inventions to the particular embodiments described. On the contrary, the intention is to cover all modifications, equivalents, and alternatives falling within the spirit and scope of the subject matter as defined by the claims.

DETAILED DESCRIPTION OF THE DRAWINGS

Hereinafter, specific embodiments will be described in more detail with reference to the accompanying drawings. The present invention may, however, be embodied in different forms and should not be construed as limited to the embodiments set forth herein.

As an explicit definition used in this application, when a layer, a film, a region or a plate is referred to as being 'on' another one, it can be directly on the other one, or one or more intervening layers, films, regions or plates may also be present. Unlike this, it will also be understood that when a layer, a film, a region or a plate is referred to as being 'directly on' another one, it is directly on the other one, and one or more intervening layers, films, regions or plates do not exist. Also, though terms like a first, a second, and a third are used to describe various components, compositions, regions and layers in various embodiments of the present invention are not limited to these terms.

Furthermore, and solely for convenience of description, elements may be referred to as "above" or "below" one another. It will be understood that such description refers to the orientation shown in the Figure being described, and that in various uses and alternative embodiments these elements could be rotated or transposed in alternative arrangements and configurations.

In the following description, the technical terms are used only for explaining specific embodiments while not limiting the scope of the present invention. Unless otherwise defined herein, all the terms used herein, which include technical or scientific terms, may have the same meaning that is generally understood by those skilled in the art.

The depicted embodiments are described with reference to schematic diagrams of some embodiments of the present invention. Accordingly, changes in the shapes of the diagrams, for example, changes in manufacturing techniques and/or allowable errors, are to be expected. Accordingly, embodiments of the present invention are not described as being limited to specific shapes of areas shown within the diagrams and may include deviations in the shapes or other shapes unless otherwise described. Further, the areas shown within the drawings are entirely schematic and their shapes are not drawn to scale and not intended to limit the scope of the present invention unless otherwise described.

FIG. 1 is a cross sectional view illustrating a high voltage power diode in accordance with an embodiment of the present invention.

Referring to FIG. 1, a high voltage power diode 100 according to an example embodiment of the present invention includes a semiconductor substrate 110, an epitaxial layer 120, an isolation layer 130, oxide isolation layers 140, a first well 150, a second well 160, a guard ring structure 170, and a P-sub region 190.

The semiconductor substrate 110 corresponds to a P-type conductivity substrate 110. For example, P-type dopants are doped into a silicon substrate to form the semiconductor substrate 110. Thus, the semiconductor substrate 110 has the P-type conductivity.

The epitaxial layer 120 is located on the semiconductor substrate 110. The epitaxial layer 120 may be formed through an epitaxial growth process. Thus, the epitaxial layer 120 may have a crystal structure, a lattice constant, and an orientation same as those of the semiconductor substrate 110.

The epitaxial layer 120 may also have a P-type conductivity. That is, the P-type dopants are doped thereinto so that the epitaxial layer 120 has the P-type conductivity.

The oxide isolation layers 140 are provided on the epitaxial layer 120 to define an anode region and a cathode region. The semiconductor substrate 110 of the power diode 100 includes an anode region in a core thereof, and a cathode region in a peripheral region surrounding the anode region of the substrate 110. The oxide isolation layers 140 may further define a P-sub region 190 to surround the cathode region in an outermost region. In addition, the oxide isolation layers 140 may define a guard ring region for further separating the cathode region from the P-sub region 190. The guard ring region corresponds to a region in which the guard ring structure 170 is positioned.

Each of the oxide isolation layers 140 may have a shallow trench isolation (STI) structure. Alternatively, each of the oxide isolation layers 140 may have a local oxidation of silicon (LOCOS) structure.

The first well 150 is formed in the epitaxial layer 120 of the anode region to have at a predetermined depth. The first well 150, for example, has a depth higher than those of the oxide isolation layers 140. The first well 150 may have an N-type conductivity.

A first impurity region 153 may be formed on an upper surface of the first well 150. The first impurity region 153 is formed by implanting high-concentration P-type impurities into the upper surface of the first well 150 with a predetermined depth. The first impurity region 153 is connected to an anode terminal 156.

The second well 160 is formed in the epitaxial layer 120 of the cathode region at a predetermined depth. The second well 160, for example, has a depth greater than those of the oxide isolation layers 140. The second well 160 may have a P-type conductivity.

A second impurity region 163 may be formed on an upper surface of the second well 160. The second impurity region 163 is formed by implanting high-concentration N-type impurities into the surface of the second well 160 with a certain depth. The second impurity region 163 is connected to a cathode terminal 165.

The guard ring structure 170 is provided on the upper surface of the epitaxial layer 120 of the guard ring region so as to be spaced apart from the second well 160 in a horizontal direction. That is, the guard ring structure 170 may be provided in the guard ring region.

Also, the guard ring structure 170 is provided to surround the cathode region. That is, the guard ring structure 170 is interposed between the cathode region and the P-sub region 190. The guard ring structure 170 may have a ring shape in a plan view. The guard ring structure 170 may be electrically isolated from the cathode region and the P-sub region by the oxide isolation layers 140.

The guard ring structure 170 includes a third well and a guard ring terminal 176 electrically connected to the anode terminal 156.

The third well includes an N-type first sub-well 171a, a P-type second sub-well 171b and an N-type third sub-well 171c arranged in the horizontal direction. Thus, the guard ring structure 170 may have an NPN structure. Further, the first sub-well 171a is electrically connected to a guard ring terminal 176.

A first sub-impurity region 173a may be provided on an upper surface of the first sub-well 171a. The first sub-impurity region 173a is formed by implanting high-concentration N-type impurities into the upper surface of the first sub-well 171a to a predetermined depth. The first sub-impurity region 173a is electrically connected to a first sub-guard ring terminal 176a.

A second sub-impurity region 173b may be provided on an upper surface of the second sub-well 171b. The second sub-impurity region 173b is formed by implanting high-concentration P-type impurities into the upper surface of the second sub-well 171b to a predetermined depth. The second sub-impurity region 173b is electrically connected to a second sub-guard ring terminal 176b.

A third sub-impurity region 173c may be provided on an upper surface of the third sub-well 171c. The third sub-impurity region 173c is formed by implanting high-concentration N-type impurities into the upper surface of the third sub-well 171c to a predetermined depth. The third sub-impurity region 173c is electrically connected to a third sub-guard ring terminal 176c.

Also, the first to the third sub-guard ring terminals 176a to 176c are connected to a main guard ring terminal 176d as a whole. Accordingly, the guard ring terminal includes the first to the third sub-guard ring terminals 176a to 176c and the main guard ring terminal 176d.

Therefore, one portion of the epitaxial layer 120 provided on a left side with respect to the first sub-well 171a serves as an emitter, the first sub-well 171a serves as a base, and the other portion of the epitaxial layer 120 provided on a right side with respect to the first sub-well 171a serves as a collector such that a first transistor of PNP type may be defined. When a forward voltage is applied between the anode terminal 156 and the cathode terminal 165, a hole current flows toward the P-sub region 190 through the first transistor of PNP type. As such, the hole current flowing toward the P-sub region 190 is reduced because the second sub-well 171b of the P-type conductivity may capture the hole current to reduce the parasitic current.

On the other hand, one portion of the epitaxial layer 120 provided on a left side with respect to the third sub-well 171c serves as an emitter, the third sub-well 171c serves as a base, and the other portion of the epitaxial layer 120 provided on a right side of the third sub-well 171c serves as a collector, such that a second transistor of PNP type may be additionally defined.

The P-sub region 190 is provided on an upper surface of the epitaxial layer 120 such that the P-sub region 190 is horizontally spaced from the guard ring structure 170. That is, the P-sub region 190 may be provided to surround the guard ring region.

The P-sub region 190 may include a fourth well 191 and a fourth impurity region 193.

The fourth well 191 is formed in the epitaxial layer 120 of the P-Sub region to have a certain depth. The fourth well 191, for example, has the depth larger than those of the oxide isolation layers 140. The fourth well 191 may have a P-type conductivity.

The fourth impurity region 193 is formed by implanting high-concentration P-type impurities into the surface of the fourth well 191. The fourth impurity region 193 is connected to a P-Sub terminal 196.

The fourth well 191 has a ring structure and may be provided to surround the first well 150, the second well 160, and the third well 170. Therefore, the fourth impurity region 193 may have a ring structure identical to that of the fourth well 191. Since the fourth impurity region 193 has the ring structure, the high voltage power diode 100 may have priority of internal operation against the parasitic operation with neighboring peripheral device. Therefore, the high voltage power diode 100 may operate more stably.

The high voltage power diode 100 according to an example embodiment of the present invention may further include a buried layer 186 interposed between the second sub-well 171b and the isolation layer 130 of N-type conductivity.

The buried layer 186 may have a P-type conductivity. The buried layer 186 includes dopants having at a concentration higher than that of the epitaxial layer 120. Therefore, a portion of the epitaxial layer 120 provided on the left side with respect to the first sub-well 171a serves as an emitter, and the first sub-well 171a serves as a base, and the buried layer 186 of the P-type conductivity serves as a collector. Therefore, a third transistor of PNP type may be defined. When a forward voltage is applied between the anode terminal 156 and the cathode terminal 165, a higher-order hole current flows toward the P-sub region 190 through the third PNP transistor.

In addition, the second sub-well 171b may be provided deeply to have a depth larger than that the first sub-well 171a.

In one embodiment of the present invention, the guard ring structure 170 may further include a P-type diffusion layer 174 provided between the first sub-well 171a and the guard ring terminal 176. That is, the P-type diffusion layer 174 may be interposed between the first sub-well 171a and the first sub-guard ring terminal 176a.

When a forward voltage is applied between the anode terminal 156 and the cathode terminal 165, the P-type diffusion layer 174 may inhibit electrons from flowing from the first guard ring terminal 176a into the first sub-well 171a while the first transistor of PNP type is operating. Therefore, a magnitude of the hole current of flowing toward the second sub-well 171b may be reduced owing to an operation of the first transistor. As a result, the parasitic current of flowing into the P-sub region 190 may be reduced.

In an embodiment of the present invention, deep wells 181 of N-type conductivity may be additionally provided between the first well 150 and the isolation layer 130, between the first sub-well 171a and the isolation layer 130, and between the third sub-well 171c and the isolation layer 130. The deep wells 181 may more completely connect between the first well 150 and the isolation layer 130, between the first sub-well 171a and the isolation layer 130, and between the third sub-well 171c and the isolation layer 130.

Figure 2:
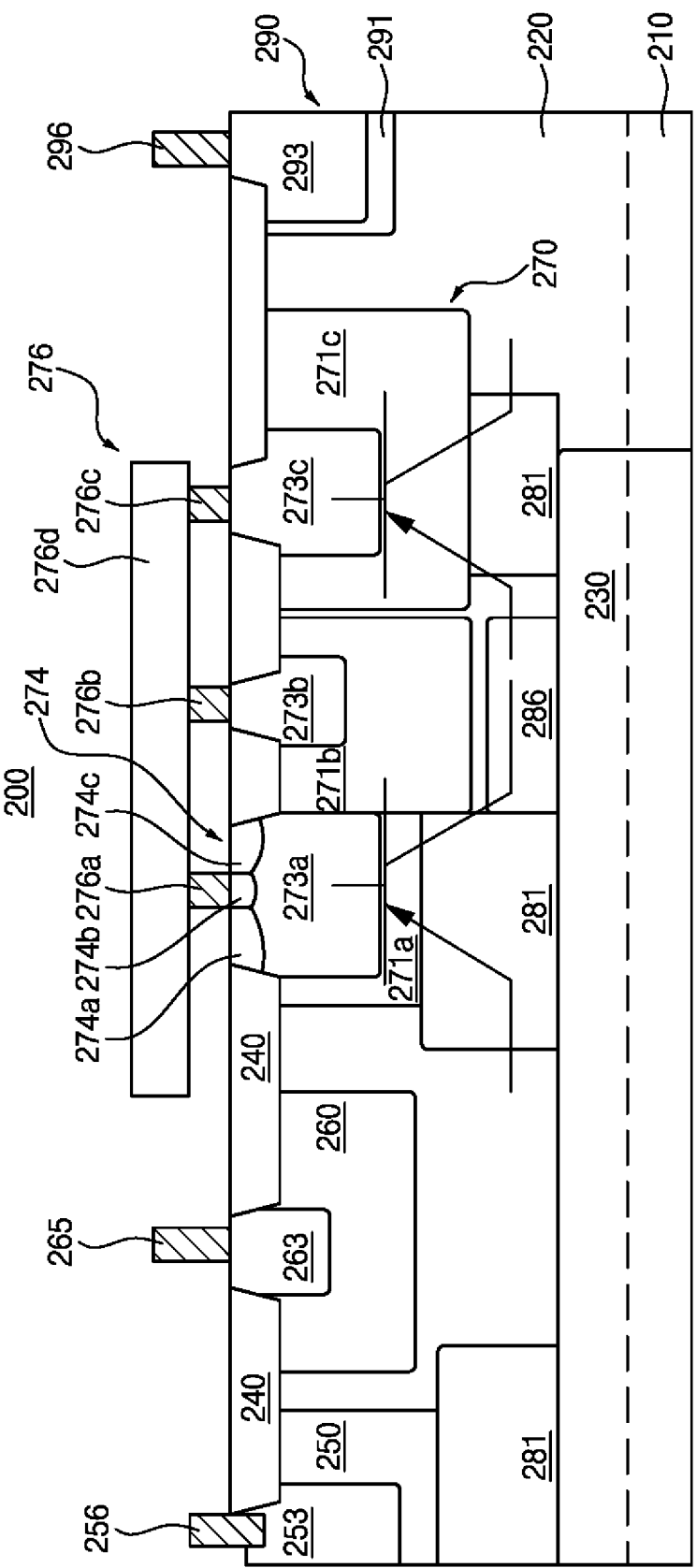
FIG. 2 is a cross sectional view illustrating a high voltage power diode in accordance with another embodiment of the present invention.

FIG. 2 is a cross sectional view illustrating a high voltage power diode in accordance with another embodiment of the present invention. In FIG. 2, the reference numerals 253, 256, 263, 265, 271c, 273a, 273b, 273c, 274, 276a, 276b, 276c, 276d, 291, 293, 296, 281 and 286 denote a first impurity region, an anode terminal, a second impurity region, a cathode terminal, a third sub-well, a first sub-impurity region, a second sub-impurity region, a third sub-impurity region, a P-type diffusion layer, a first sub-guard ring terminal, a second sub-guard ring terminal, a third sub-guard ring terminal, a main guard ring terminal, a fourth well, a fourth impurity region, a P-sub terminal, deep wells and a buried layer, respectively.

Referring to 2, a high voltage power diode 200 according to an example embodiment of the present invention includes a semiconductor substrate 210, an epitaxial layer 220, an isolation layer 230, oxide isolation layers 240, a first well 250, a second well 260, a guard ring structure 270, and a P-sub region 290.

The semiconductor substrate 210, the epitaxial layer 220, the isolation layer 230, the oxide isolation layers 240, the first well 250, the second well 260, the guard ring structure 270, and the P-sub region are similar to those of the high voltage power diode described above with reference to FIG. 1 except for the guard ring structure 270, and so a detailed description thereof will be omitted. Therefore, the guard ring structure 270 will be mainly described.

The guard ring structure 270 is provided between a first sub-well 271a and a guard ring terminal 276, and may include a first diffusion layer 274a of P-type conductivity, a second diffusion layer 274b of N-type conductivity and a third diffusion layer 274c of a P-type conductivity. That is, the first diffusion layer 274a, the second diffusion layer 274b, and the third diffusion layer 274c may have a PNP structure.

As the first and third diffusion layers 274a and 274c have the P-type conductivity, electrons may be suppressed from flowing from the first sub-well 271a to a first transistor of PNP type to reduce an electron current which flows internally in the first transistor. Accordingly, a magnitude of the hole current toward a second sub-well 271b may be reduced according to an operation of the first transistor. As a result, a parasitic current flowing to the P-sub region 290 may be reduced.

Meanwhile, since the second diffusion layer 274b has an N-type conductivity, the holes injected into the first sub-well 271a may be effectively filled due to the operation of the first transistor.

Figure 3:
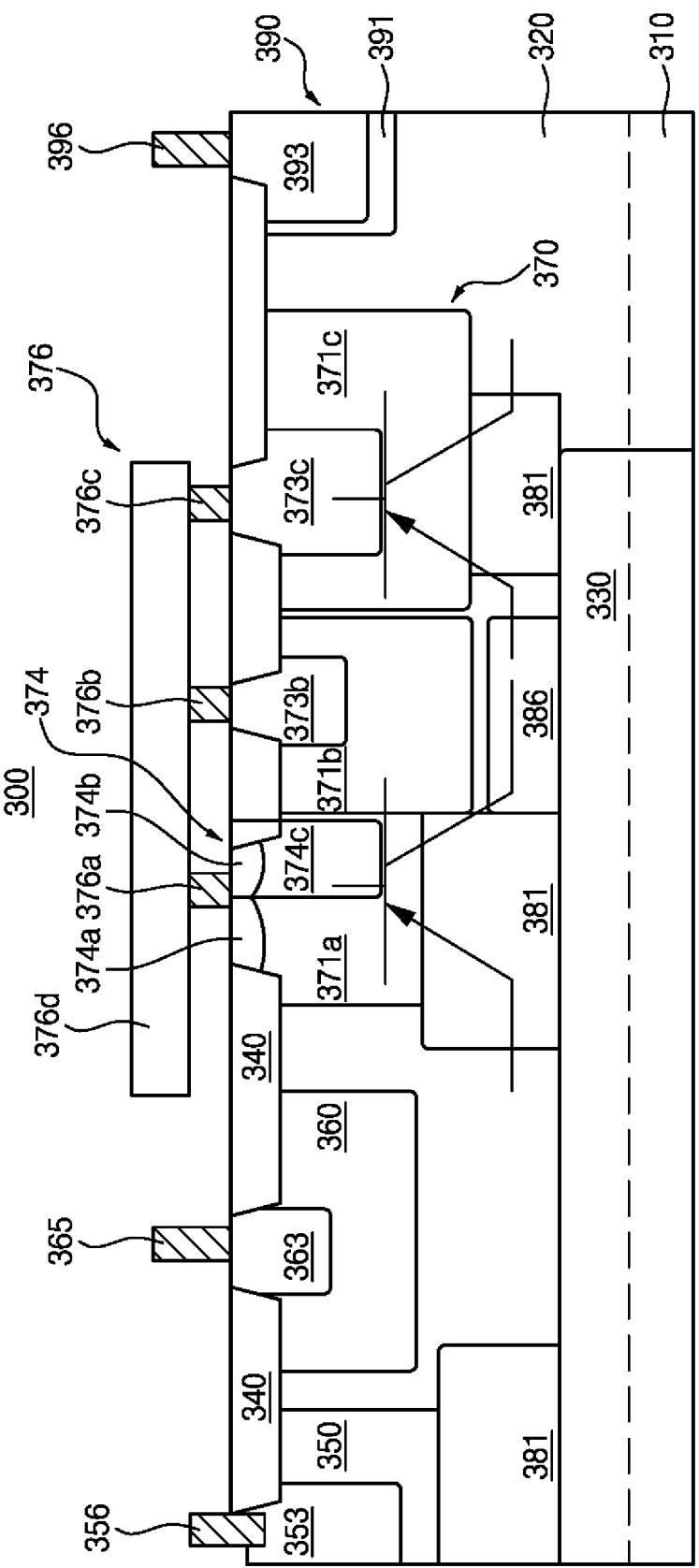
FIG. 3 is a cross sectional view illustrating a high voltage power diode in accordance with still another embodiment of the present invention.

FIG. 3 is a cross sectional view illustrating a high voltage power diode in accordance with another embodiment of the present invention. In FIG. 3, the reference numerals 353, 356, 363, 365, 371b, 371c, 373b, 373c, 374, 376a, 376b, 376c, 376d, 391, 393, 396, 381 and 386 denote a first impurity region, an anode terminal, a second impurity region, a cathode terminal, a second sub-well, a third sub-well, a second sub-impurity region, a third sub-impurity region, a P-type diffusion layer, a first sub-guard ring terminal, a second sub-guard ring terminal, a third sub-guard ring terminal, a main guard ring terminal, a fourth well, a fourth impurity region, a P-sub terminal, deep wells and a buried layer, respectively.

Referring to FIG. 3, a high voltage power diode 300 according to an example embodiment of the present invention includes a semiconductor substrate 310, an epitaxial layer 320, a isolation layer 330, oxide isolation layers 340, a first well 350, a second well 360, a guard ring structure 370, and a P-sub region 390.

The semiconductor substrate 310, the epitaxial layer 320, the isolation layer 330, the oxide isolation layers 340, the first well 350, the second well 360, the guard ring structure 370, and the P-sub region 390 in the embodiment shown in FIG. 3 are similar to those of the high voltage power diode described above with reference to FIG. 1, in contrast with the guard ring structure 370, which is different. Accordingly, a detailed description of those components will be omitted in order to avoid any redundancy. Therefore, the guard ring structure 370 will be mainly described below.

The guard ring structure 370 may include a fourth diffusion layer 374a of N-type conductivity and a fifth diffusion layer 374b of P-type conductivity, which are provided between a first sub-well 371a and a guard ring terminal 376. Here, the guard ring structure 370 may further include a fifth P-type impurity region 374c surrounding the P-type fifth diffusion layer 374b.

As the fourth diffusion layer 374a has N-type conductivity, the holes introduced into the first sub-well 371a according to an operation of the first transistor may be effectively charged into the first sub-well 371a. On the other hand, the fifth diffusion layer 374c has the P-type conductivity, so that electron charging into the first sub-well 371a according to the operation of the first transistor may be improved.

As described above, the power diode according to the embodiments of the present invention is used as a high voltage/low-current DC/AC converter. Further, the power diode is applied to various applications such as an electrostatic protection diode.

Although the high voltage power diode has been described with reference to the specific embodiments, they are not limited thereto. Therefore, it will be readily understood by those skilled in the art that various modifications and changes can be made thereto without departing from the spirit and scope of the appended claims.

Various embodiments of systems, devices, and methods have been described herein. These embodiments are given only by way of example and are not intended to limit the scope of the claimed inventions. It should be appreciated, moreover, that the various features of the embodiments that have been described may be combined in various ways to produce numerous additional embodiments. Moreover, while various materials, dimensions, shapes, configurations and locations, etc. have been described for use with disclosed embodiments, others besides those disclosed may be utilized without exceeding the scope of the claimed inventions.

Persons of ordinary skill in the relevant arts will recognize that the subject matter hereof may comprise fewer features than illustrated in any individual embodiment described above. The embodiments described herein are not meant to be an exhaustive presentation of the ways in which the various features of the subject matter hereof may be combined. Accordingly, the embodiments are not mutually exclusive combinations of features; rather, the various embodiments can comprise a combination of different individual features selected from different individual embodiments, as understood by persons of ordinary skill in the art. Moreover, elements described with respect to one embodiment can be implemented in other embodiments even when not described in such embodiments unless otherwise noted.

Although a dependent claim may refer in the claims to a specific combination with one or more other claims, other embodiments can also include a combination of the dependent claim with the subject matter of each other dependent claim or a combination of one or more features with other dependent or independent claims. Such combinations are proposed herein unless it is stated that a specific combination is not intended.

Any incorporation by reference of documents above is limited such that no subject matter is incorporated that is contrary to the explicit disclosure herein. Any incorporation by reference of documents above is further limited such that no claims included in the documents are incorporated by reference herein. Any incorporation by reference of documents above is yet further limited such that any definitions provided in the documents are not incorporated by reference herein unless expressly included herein.

For purposes of interpreting the claims, it is expressly intended that the provisions of 35 U.S.C. § 112(f) are not to be invoked unless the specific terms "means for" or "step for" are recited in a claim.

The invention claimed is:

1. A high voltage power diode comprising:
   a semiconductor substrate having a first conductivity type;
   an epitaxial layer arranged on the semiconductor substrate and having the first conductivity type;
   an isolation layer arranged at a lower portion of the epitaxial layer, the isolation layer having a second conductivity type and extending in a horizontal direction;
   an oxide isolation layer provided at an upper surface of the epitaxial layer, the oxide isolation layer defining the epitaxial layer into an anode region and a cathode region, wherein the cathode region surrounds the anode regions;
   a first well having the second conductivity type and arranged at an upper surface of the epitaxial layer and in the anode region, the first well configured to be electrically connect to an anode terminal;
   a second well having the first conductivity type and arranged on the upper surface of the epitaxial layer and in the cathode region, the second well configured to be electrically connected to the cathode terminal;
   a guard ring structure provided on the upper surface of the epitaxial layer and spaced apart from the second well in a horizontal direction, the guard ring structure including a third well having a first sub-well having the second conductivity type, a second sub-well having the first conductivity type, and a third sub-well having the second conductivity type, wherein the first, second, and third sub-wells are arranged in the horizontal direction relative to one another, and a guard ring terminal electrically connected to the anode terminal; and
   a P-sub region provided on the upper surface of the epitaxial layer and spaced apart from the guard ring structure in the horizontal direction.

2. The high voltage power diode of claim 1, further comprising a buried layer having the first conductivity type and interposed between the second sub-well and the isolation layer.

3. The high voltage power diode of claim 1, wherein the guard ring structure further includes a diffusion layer having the first conductivity type and interposed between the first sub-well and the guarding ring terminal.

4. The high voltage power diode of claim 1, wherein each of the second and the third wells has a ring structure and circumscribes the first well.

5. The high voltage power diode of claim 1, wherein the second sub-well defines a depth larger than a depth of the first sub-well.

6. The high voltage power diode of claim 1, further comprising a plurality of deep wells having the second conductivity type, wherein each of the deep wells is arranged between either the first well and the isolation layer, the first sub-well and the isolation layer, or between the third sub-well and the isolation layer.

7. The high voltage power diode of claim 1, wherein the P-sub region includes a fourth well having the first conductivity type, wherein the P-sub region is spaced apart from the guard ring structure in the horizontal direction.

8. The high voltage power diode of claim 1, wherein the guard ring structure further includes a first diffusion layer having the first conductivity type, a second diffusion layer having the second conductivity type, and a third diffusion layer of having the first conductivity type, arranged together sequentially along the horizontal direction, the first, second, and third diffusion layers all arranged between the first sub-well and the guard ring terminal in a direction perpendicular to the horizontal direction.

9. The high voltage power diode of claim 1, wherein the guard ring structure further includes a fourth diffusion layer having the second conductivity type and a fifth diffusion layer of having the first conductivity type and arranged in the horizontal direction, the fourth and the fifth diffusion layers interposed between the first sub-well and the guard ring terminal.

10. The high voltage power diode of claim 9, wherein the guard ring structure further includes an impurity region surrounding the fifth diffusion layer.

* * * * *